United States Patent
Pu et al.

(10) Patent No.: US 10,076,040 B2
(45) Date of Patent: Sep. 11, 2018

(54) PACKAGING STRUCTURE AND PACKAGING METHOD OF ELECTRONIC PRODUCT

(71) Applicants: LITE-ON ELECTRONICS (GUANGZHOU) LIMITED, Guangzhou (CN); LITE-ON TECHNOLOGY CORPORATION, Taipei (TW)

(72) Inventors: Yi-Feng Pu, Taipei (TW); Po-Yu Cheng, Taipei (TW); Tzu-Shu Lin, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/460,271

(22) Filed: Mar. 16, 2017

(65) Prior Publication Data

US 2018/0184528 A1    Jun. 28, 2018

(30) Foreign Application Priority Data

Dec. 23, 2016    (CN) .......................... 2016 1 1206825

(51) Int. Cl.
| | |
|---|---|
| H05K 3/28 | (2006.01) |
| H05K 1/18 | (2006.01) |
| H05K 3/30 | (2006.01) |
| H05K 3/46 | (2006.01) |
| H05K 1/02 | (2006.01) |

(52) U.S. Cl.
CPC ............. *H05K 3/284* (2013.01); *H05K 1/028* (2013.01); *H05K 1/0216* (2013.01); *H05K 1/0274* (2013.01); *H05K 1/185* (2013.01); *H05K 3/303* (2013.01); *H05K 3/4688* (2013.01); *H05K 2201/09009* (2013.01)

(58) Field of Classification Search
USPC .................................................. 361/749, 748
See application file for complete search history.

(56) References Cited

U.S. PATENT DOCUMENTS

| | | | | |
|---|---|---|---|---|
| 2006/0104037 A1* | 5/2006 | Smith | .................. | H05K 3/0014 |
| | | | | 361/728 |
| 2015/0313003 A1* | 10/2015 | Kasar | ..................... | H05K 3/284 |
| | | | | 361/749 |

* cited by examiner

*Primary Examiner* — Andargie M Aychillhum
(74) *Attorney, Agent, or Firm* — McClure, Qualey & Rodack, LLP

(57) ABSTRACT

A packaging structure and a packaging method of an electronic product are disclosed. The packaging structure of an electronic product includes a supporting structure, a flexible board and a covering layer. The supporting structure has a shape. The flexible board is stacked on the supporting structure, and has an electronic device disposed thereon. The covering layer is attached on the stacked supporting structure and flexible board and covering the electronic device. The shapes of the flexible board and the covering layer conform to the shape of the supporting structure, and the flexible board and the electronic device are tightly interposed between the covering layer and the supporting structure. The covering layer includes a thermoforming film and at least a function film stacked on the thermoforming film.

12 Claims, 4 Drawing Sheets

PACKAGING STRUCTURE AND PACKAGING METHOD OF ELECTRONIC PRODUCT

This application claims the benefit of People's Republic of China application Serial No. 201611206825.4 filed Dec. 23, 2016, the subject matter of which is incorporated herein by reference.

BACKGROUND OF THE INVENTION

Field of the Invention

The invention relates in general to a product and a manufacturing method, and more particularly to a packaging structure and a packaging method of an electronic product.

Description of the Related Art

According to the currently used method for manufacturing a water-proof and dust-proof electronic product, there is normally a rubber strip interposed between two plastic casings covering an electronic device and then the rubber strip are laminated with the two plastic casings by pressure to avoid external moisture and dust entering the interior of the two plastic casings. However, such method still cannot guarantee a 100% water-proof effect, and moisture may infiltrate via the gap between the plastic casings and the rubber strip and cause damage to the electronic device. Another method for manufacturing an electronic product is to use an in-mold electronic (IME) technology. An electronic device is firstly mounted on a film, and then the film with the electronic device is placed in an injection mold. Then, a melted plastic material is injected into the injection mold, such that the melted plastic material and the film with the electronic device are bonded together. Although such method may achieve a water-proof effect, the yield rate of the injection method is low, and the electronic device disposed on the film still may be collided by the injected plastics and become damaged.

SUMMARY OF THE INVENTION

The invention is directed to a packaging structure and a packaging method of an electronic product. In the electronic product, an electronic device and a flexible board are tightly interposed between a covering layer and a supporting structure by using an out-mold packaging technology to avoid the electronic device being collided and damaged by injected plastics.

According to one embodiment of the present invention, a packaging structure of an electronic product is provided. The packaging structure includes a supporting structure, a flexible board and a covering layer. The supporting structure has a shape. The flexible board is stacked on the supporting structure, and an electronic device is disposed on the flexible board. The covering layer is attached on the stacked supporting structure and flexible board to cover the electronic device. The shapes of the flexible board and the covering layer conform to the shape of the supporting structure. The flexible board and the electronic device are tightly interposed between the covering layer and the supporting structure. The covering layer includes a thermoforming film and at least a function film stacked on the thermoforming film.

According to another embodiment of the present invention, a packaging method of an electronic product is provided. The packaging method of an electronic product includes following steps. A supporting structure is processed so that the supporting structure has a shape. An electronic device is mounted on a flexible board, and the flexible board is stacked on the supporting structure. A covering layer is formed on the stacked supporting structure and flexible board to cover the electronic device. The covering layer comprises a thermoforming film and at least a function film stacked on the thermoforming film, and the thermoforming film is heated and deformed, such that the shapes of the flexible board and the covering layer conform to the shape of the supporting structure, and the flexible board and the electronic device are tightly interposed between the covering layer and the supporting structure.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the invention.

Figure 8:
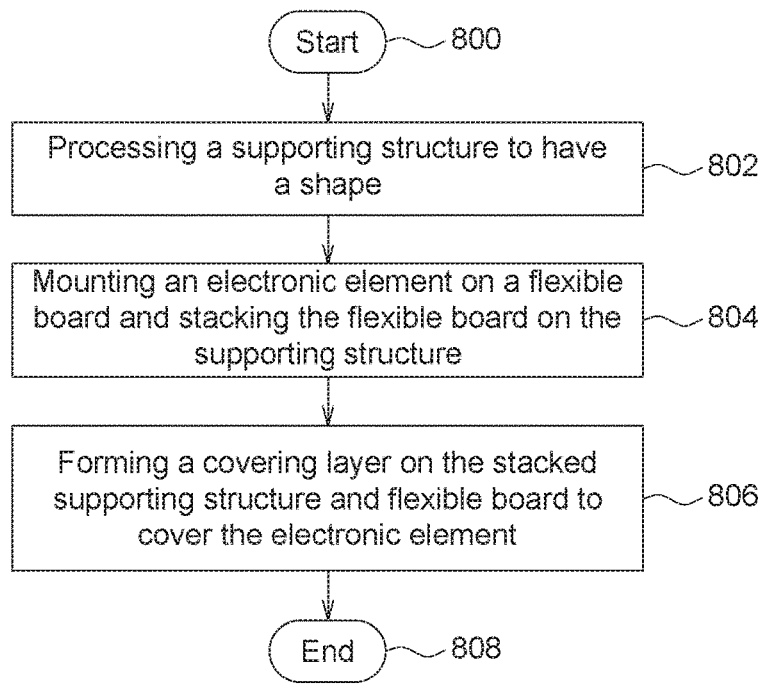
FIG. 8 is a flowchart of a manufacturing method of an electronic product according to an embodiment of the present invention.

Refer to FIGS. 1-5 and FIG. 8. FIG. 8 is a manufacturing method 80 of a package structure of an electronic product according to an embodiment of the present invention. The manufacturing method 80 includes following steps.

In step 800, the method starts.

In step 802, a supporting structure 101 is processed to have a shape.

In step 804, an electronic device 103 is mounted on a flexible board 102, and the flexible board 102 is then stacked on the supporting structure 101.

In step 806, a covering layer 105 is formed on the stacked supporting structure 101 and flexible board 102 and covers the electronic device 103.

In step 808, the method terminates.

Figure 1:
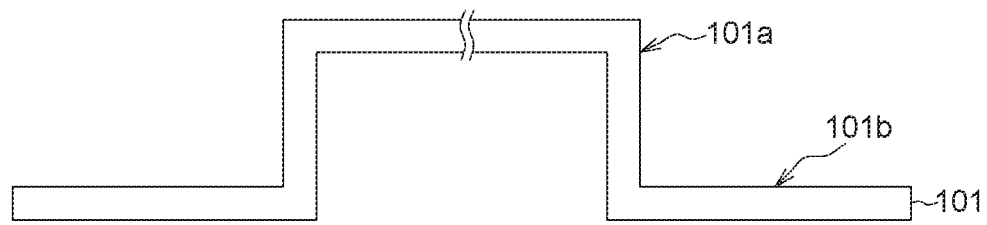
FIGS. 1-5 are flowcharts of a manufacturing method of an electronic product according to an embodiment of the present invention.

As shown in step 802 and FIG. 1, the supporting structure 101 is processed to have a shape. For example, the shape has a concave/convex surface 101*a* and/or a flat surface 101*b*. As shown in step 804 and FIGS. 2 and 3, the electronic device 103 is mounted on the flexible board 102, and the flexible board 102 is then stacked on the supporting structure 101. As shown in step 806 and FIGS. 4-5, the covering layer 105 is formed on the stacked supporting structure 101 and flexible board 102 to cover the electronic device 103. Thus, the packaging method of an electronic product is basically completed.

As shown in FIG. 1, the material of the supporting structure 101 may be polymer, metal or ceramic, not limited to be in the form of a single material. The material of the supporting structure 101 may also be a composite material containing at least two materials. The supporting structure 101 may be processed to have any shapes, such as square, circle or polygon, which is not limited to a 2D structure or a 3D structure. In an embodiment, the supporting structure 101 is of rigid structure such as casing, panel, dashboard or frame. If the supporting structure 101 is made of a metal, then the supporting structure 101 may be formed by one of the processes such as the casting process, the turning process, and the stamping and extruding process. If the supporting structure 101 is made of a ceramic material, then the supporting structure 101 is formed by one of the processes including the powder injection molding process and the sintering process. If the supporting structure 101 is made of a plastic material, the supporting structure 101 is formed by one of the injection molding process, the blown film extrusion process and the pultrusion process. The present invention does not limit the manufacturing method and the material of the supporting structure 101 unless a specific shape/material feature is required.

Figure 2:
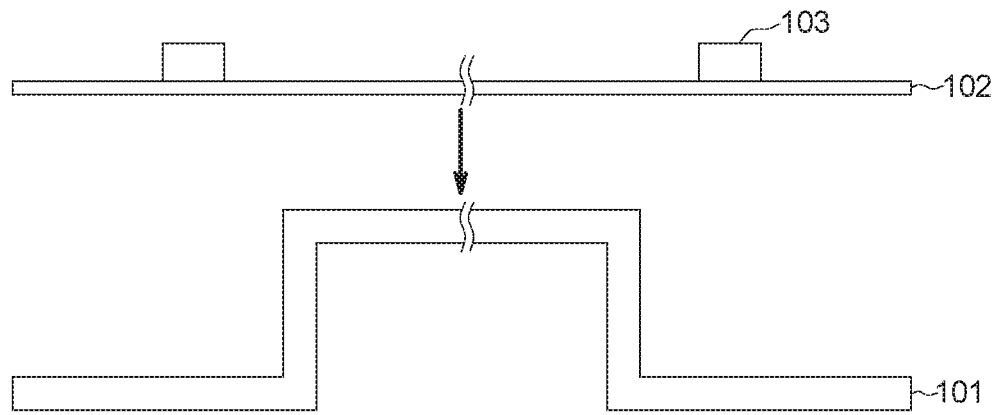
Figure 3:
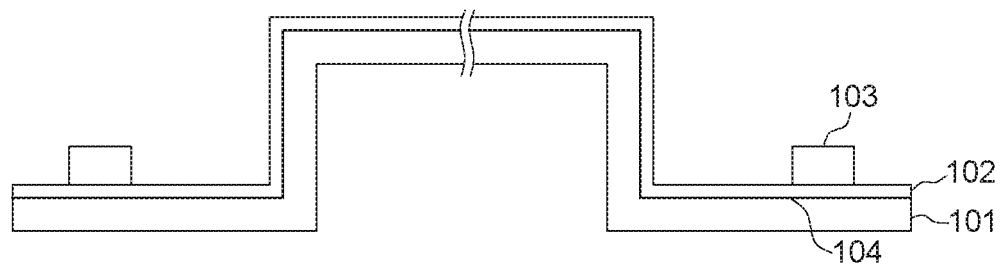

As shown in FIG. 2, the flexible board 102 of the present embodiment is a combination of an insulation substrate and an electronic circuit. Exemplarily but not restrictively, the insulation substrate may be made of at least one of high molecular polymers, such as polyimide (PI), polyethylene terephthalate (PET), polycarbonate (PC), polymethylmethacrylate (PMMA), polypropylene (PP), polyethylene (PE), polyvinyl chloride (PVC), polyethyleneimine (PEI), silica gel and silicone, thermoplastic elastomer (TPE) or a ceramic material, such as quartz or glass. The electronic circuit may be formed of any conductive metal. Besides, the electronic device 103 may be an integrated circuit (IC) device including active and/or passive devices, such as transistors, diodes, capacitors, and/or resistors. Such devices may be integrated on a semiconductor chip to form a household or industrial IC, which is installed inside home appliances such as TVs, refrigerators, and washing machines. In an embodiment, the electronic device 103 may be mounted on the flexible board 102 of any kind via outer leads to electrically connect to the electronic circuit mounted on the flexible board 102 for transmitting or receiving electronic signals via the flexible board 102. Since the flexible board 102 is flexible or foldable to conform to the shape of the supporting structure 101, the signal transmission path is changed accordingly. Furthermore, the flexible board 102 having the electronic device 103 mounted thereon is attached on the supporting structure 101 via an adhesive 104, such that the flexible board 102 is stacked on a surface of the supporting structure 101, for example, on an inner surface or an outer surface of the supporting structure 101. After the flexible board 102 is stacked on the supporting structure 101, the flexible board 102 and the supporting structure 101 may have identical or similar shapes as shown in FIG. 3.

In the packaging structure 100 of the present invention, the flexible board 102 is used as a substrate for carrying the electronic device 103, and the flexible board 102 has the insulation layer. The flexible board 102 is attached on the supporting structure 101 via the adhesive 104 and therefore will not come off the supporting structure 101 easily. Due to the insulating and anti-static functions of the insulation layer of the flexible board 102, the electronic device 103 and the supporting structure 101 possess better electrical insulation and therefore static electricity and electrostatic interference may be avoided. The adhesive 104 mentioned in the present embodiment is only for exemplary purpose, not for limiting the present invention. For example, in other embodiments, the flexible board 102 may be fixed on the supporting structure 101 by ways of out-mold packaging method, high-temperature vacuum adsorption method, heat pressing method, ultrasonic welding method or other adhering methods. In other embodiments, the position of the electronic device 103 may also be adjusted for different needs. For example, the electronic device 103 may be interposed between the flexible board 102 and the supporting structure 101. The above exemplification is not for limiting the present invention.

Figure 4:
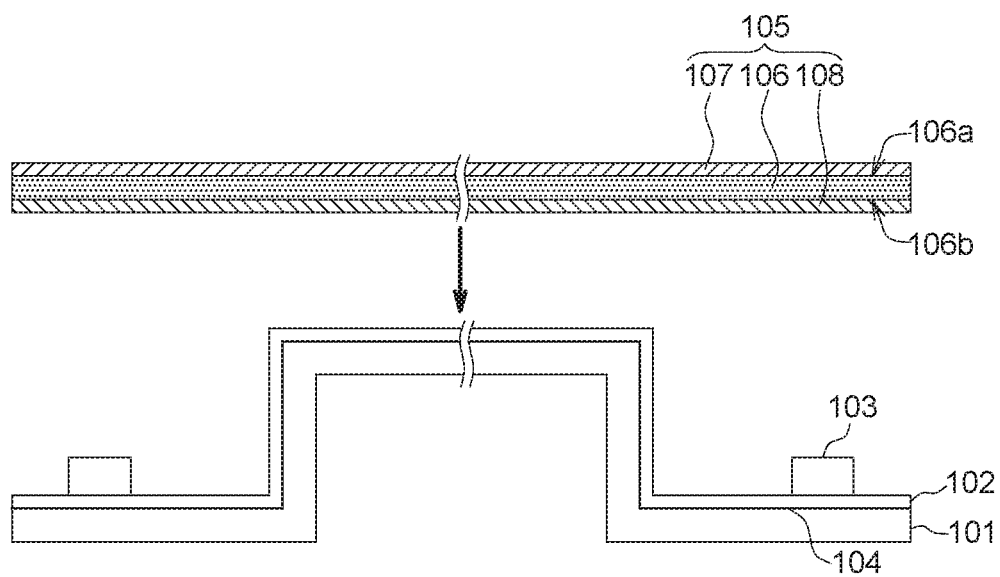
Figure 5:
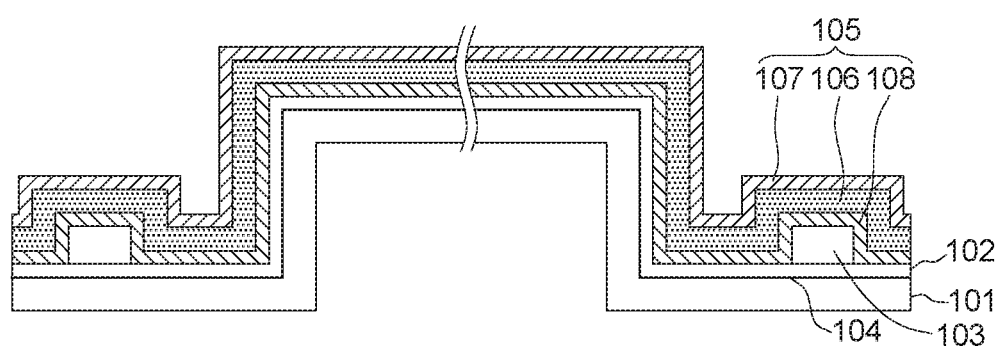

As shown in FIG. 4 and FIG. 5, the covering layer 105, which may have two or more layers, is located on the stacked flexible board 102 and supporting structure 101 to cover the electronic device 103. In an embodiment, the covering layer 105 at least includes a thermoforming film 106. The thermoforming film 106 may be a thermally deformable polymer film. When the conditions of temperature, vacuum and pressure of the process are met, the thermoforming film 106 may be deformed to attach on the flexible board 102 and the supporting structure 101. Accordingly, the thermoforming film 106 may be tightly bonded on the supporting structure 101, which cannot be easily removed by an external force. Moreover, in an embodiment, the covering layer 105 includes at least one water-proof and dust-proof function film to prevent the electronic device 103 from being affected by moisture or dust. In other embodiments, the covering layer 105 may further include a heat-conducting or shielding function film for dissipating the heat generated by the electronic device 103 or avoid the electronic device 103 being interfered by electromagnetic waves. Besides, the covering layer 105 may further include a decorative layer for decorating the external appearance of the electronic product, such that the external appearance of the electronic product may have metal texture, glossy surface, pattern decoration or various colors. Depending on the needs of use, in other embodiments, the covering layer 105 may further include different function layers. For example, the covering layer 105 may include a light diffusion layer, which increases optical properties, or any other function layers, which is compatible with the polymer film. The above exemplifications are not for limiting the present invention.

In an embodiment, the covering layer 105 is tightly bonded on the stacked supporting structure 101 and flexible board 102 by using the out-mold packaging technology through the process of heating, forming and pressurization in a vacuum environment. Comparing to the in-mold electronics (IME) technology, which requires a high temperature and high pressure forming process in the mold, the out-mold packaging technology of the present embodiment may eliminate the negative impacts, such as high adhesive-melting temperature, high molding temperature, high molding pressure and high injection speed during the injection molding process, and therefore the packaging method of the present embodiment increases the yield rate of the packaging structure and expands the fields of application. The covering layer 105 has water-proof and dust-proof functions, and the covering layer 105 may further be equipped with at least one of decorating function, heat conducting function and shielding function. The covering layer 105 may be applied on a complicated 3D curved surface. The material of the covering layer 105 is not restricted, and the covering layer 105 may tightly bonded on the flexible board 102 and cannot be easily removed by an external force.

Refer to FIG. 4. The covering layer 105 includes a first function film 107, a thermoforming film 106 and a second function film 108, which are stacked in sequence. The first function film 107 is disposed on a first surface 106a of the thermoforming film 106. The second function film 108 is disposed on a second surface 106b of the thermoforming film 106. The first surface 106a and the second surface 106b are opposite to each other. In an embodiment, the first function film 107 may be at least one of a decorative layer, a thereto-conducting layer, a shielding layer and a light diffusion layer. The second function film 108 may be at least one of a decorative layer, a thereto-conducting layer, a shielding layer and a light diffusion layer. The first function film 107 and the second function film 108 may be films of identical function or different functions, and it does not limit the present invention. The first function film 107 and the second function film 108 may be formed on any surface of the thermoforming film 106, such as on the same surface or different surfaces, by ways of screen printing, offset printing, gravure printing, flexographic printing, transfer printing, carving printing or other printing methods. The present invention is not limited to above.

The thermoforming film 106 may be made of a thermoplastic material such as polycarbonate (PC), polyetherimide (PEI), polymethylmethacrylate (PMMA), polyethylene terephthalate (PET), and polybutylene terephthalate (PBT), which is widely used in the packaging of various products, and has the advantages of high tensile strength, large elongation, high elasticity, tear-proof, high viscosity, thin thickness, pressure resistance, water-proof and dust-proof. In an embodiment, the thermoforming film 106 has a thickness between 0.01 mm~0.5 mm, and a shrinkage temperature between 120° C.~180° C.

Refer to FIG. 5. In a low pressure (or in vacuum) environment, the covering layer 105 is heated, and the air between the covering layer 105 and the stacked supporting structure 101 and flexible board 102 is vacuumed, such that the thermoforming film 106, the first function film 107 and the second function film 108 completely cover the upper surface of the flexible board 102. The shapes of the flexible board 102 and the covering layer 105 basically conform to the shape of the supporting structure 101. However, it is possible that in some areas (such as the right angle areas), the shapes of the flexible board 102 and the covering layer 105 may not match the shape of the supporting structure 101. Since the thermoforming film 106 is deformed when being heated, the flexible board 102 and the electronic device 103 is tightly interposed (almost seamlessly) between the covering layer 105 and the supporting structure 101 to well protect the electronic device 103. After the packaging method shown in FIG. 1 to FIG. 5 is completed, a packaging structure 100 of an electronic product is obtained accordingly.

Figure 6:
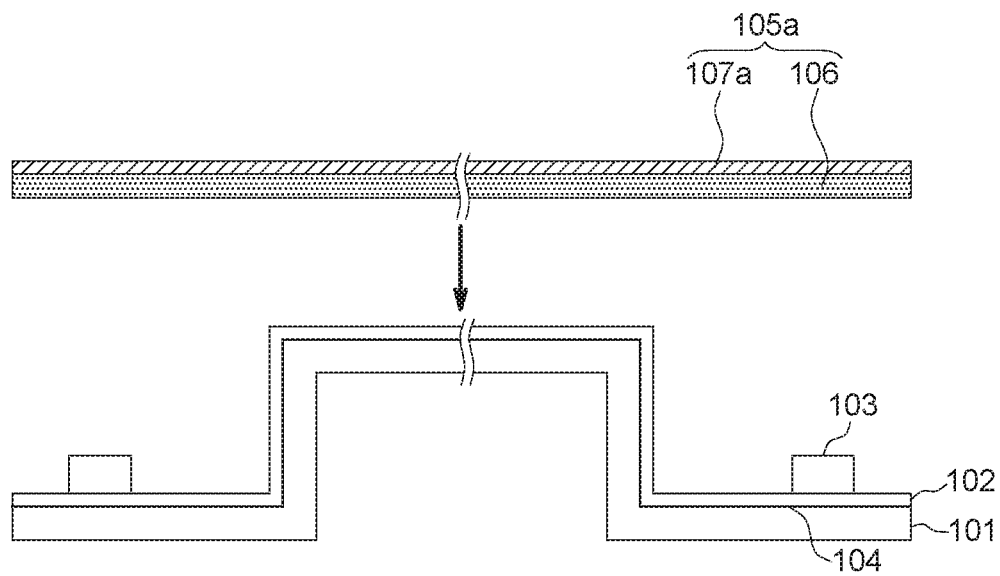
FIG. 6 is a schematic diagram of a packaging method of an electronic product by using a covering layer according to another embodiment of the present invention.

Refer to FIG. 6. In another embodiment, the covering layer 105a includes a thermoforming film 106 and a function film 107a. The function film 107a is exemplarily located on the top surface of the thermoforming film 106, such that the thermoforming film 106 is located between the function film 107a and the flexible board 102, and the bottom surface of the thermoforming film 106 is directly attached on the flexible board 102 and the electronic device 103. The function and formation of the function film 107a are similar to that of the first function film 107 of above embodiments, and the similarities are not repeated here.

Figure 7:
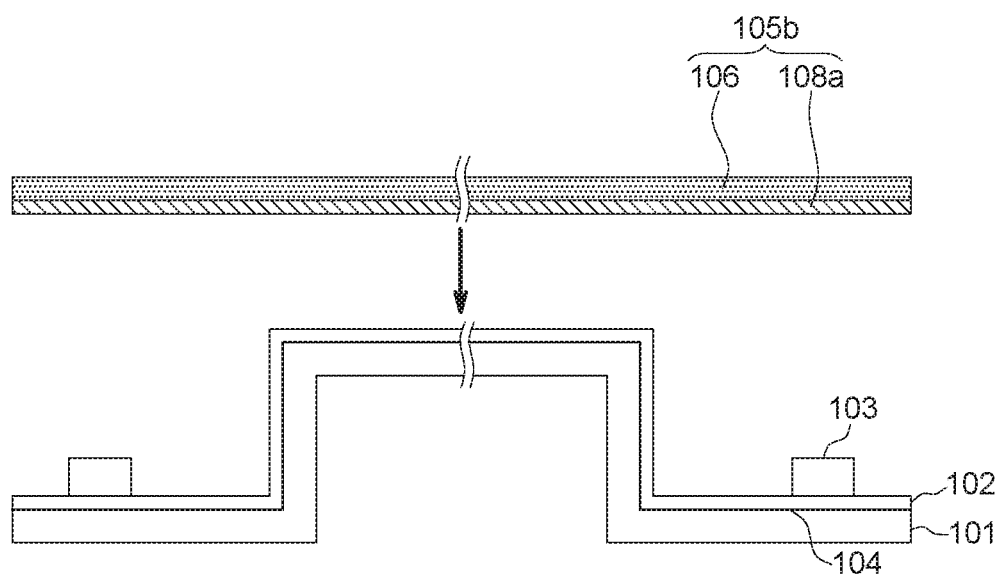
FIG. 7 is a schematic diagram of a packaging method of an electronic product by using a covering layer according to another embodiment of the present invention.

Refer to FIG. 7. In another embodiment, the covering layer 105b includes a thermoforming film 106 and a function film 108a. The function film 108a is exemplarily located on the bottom surface of the thermoforming film 106, such that the function film 108a is located between the thermoforming film 106 and the flexible board 102, and the bottom surface of the function film 108a is directly attached on the flexible board 102 and the electronic device 103. The function and formation of the function film 108a are similar to that of the first function film 107 of above embodiments, and the similarities are not repeated here.

A packaging structure and a packaging method of an electronic product are disclosed in above embodiments of the present invention. Firstly, the flexible board having an electronic device is attached on the pre-formed supporting structure, and then the covering layer tightly covers the flexible board and the supporting structure by using the out-mold packaging technology to improve the packaging of the electronic device, so as to avoid the electronic device being collided and damaged by injection plastics. The covering layer of the present embodiment adopts the out-mold packaging technology, and has water-proof and dust-proof functions. The covering layer may further be equipped with at least one of decorating function, heat conducting function and shielding function, and may be formed on a complicated 3D curved surface. The material of the covering layer is not limited, and the covering layer is tightly bonded on the flexible board and cannot be easily removed by an external force.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A packaging structure of an electronic product, comprising:
    a supporting structure having a shape;
    a flexible board stacked on the supporting structure, wherein an electronic device is disposed on the flexible board; and
    a covering layer attached on the stacked supporting structure and flexible board, wherein the covering layer directly contacts the flexible board and directly covers the electronic device, wherein the covering layer comprises a thermoforming film and at least a function film stacked on the thermoforming film, wherein the function film is at least one of a decorative layer, a thermo-conducting layer, a shielding layer and a light diffusion layer,
    wherein the thermoforming film has a shrinkage temperature and is thermally deformable when the thermoforming film is heated up to the shrinkage temperature to make the function film tightly attached on the flexible board, such that shapes of the flexible board and the covering layer conforms to the shape of the supporting structure, the flexible board and the electronic device are tightly interposed between the covering layer and the supporting structure.

2. The packaging structure of an electronic product according to claim 1, wherein the flexible board comprises an insulation substrate and an electronic circuit.

3. The packaging structure of an electronic product according to claim 2, wherein the function film is disposed between the thermoforming film and the flexible board.

4. The packaging structure of an electronic product according to claim 2, wherein the thermoforming film is disposed between the function film and the flexible board.

5. The packaging structure of an electronic product according to claim 1, wherein the function film comprises a first function film and a second function film, the first function film is disposed on a first surface of the thermoforming film, and the second function film is disposed on a second surface of the thermoforming film, the first surface is opposite to the second surface.

6. The packaging structure of an electronic product according to claim 5, wherein the first function film and the second function film are at least one of the decorative layer, the thermo-conducting layer, the shielding layer and the light diffusion layer.

7. The packaging structure of an electronic product according to claim 1, wherein the packaging structure further comprises an adhesive interposed between the flexible board and the supporting structure, or the flexible board and the supporting structure are firmly bonded by using an out-mold packaging method, a high-temperature vacuum adsorption method, a heat pressing method or an ultrasonic welding method.

8. A packaging method of an electronic product, comprising:
    processing a supporting structure so that the supporting structure has a shape;
    mounting an electronic device on a flexible board and stacking the flexible board on the supporting structure; and
    forming a covering layer on the stacked supporting structure and flexible board to make the covering layer directly contact the flexible board and directly cover the electronic device, wherein the covering layer comprises a thermoforming film and at least a function film stacked on the thermoforming film, wherein the function film is at least one of a decorative layer, a thermo-conducting layer, a shielding layer and a light diffusion layer, and the thermoforming film has a shrinkage temperature and is thermally deformable when being heated up to the shrinkage temperature to make the function film tightly attached on the flexible board, such that shapes of the flexible board and the covering layer conform to the shape of the supporting structure, and the flexible board and the electronic device are tightly interposed between the covering layer and the supporting structure.

9. The packaging method of an electronic product according to claim 8, wherein the flexible board comprises an insulation substrate and an electronic circuit.

10. The packaging method of an electronic product according to claim 8, wherein the function film comprises a first function film and a second function film respectively formed on a first surface and a second surface of the thermoforming film, and the first surface is opposite to the second surface.

11. The packaging method of an electronic product according to claim 10, wherein the first function film and the second function film are at least one of the decorative layer, the thermo-conducting layer, the shielding layer and the light diffusion layer.

12. The packaging method of an electronic product according to claim 8, wherein the packaging structure further comprises an adhesive interposed between the flexible board and the supporting structure, or the flexible board and the supporting structure are bonded by using an out-mold packaging method, a high-temperature vacuum adsorption method, a heat pressing method or an ultrasonic welding method.

* * * * *